(12) United States Patent
Isobe et al.

(10) Patent No.: US 8,059,465 B2
(45) Date of Patent: Nov. 15, 2011

(54) NON-VOLATILE SEMICONDUCTOR MEMORY DEVICE

(75) Inventors: Katsuaki Isobe, Yokohama (JP); Masatsugu Kojima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/571,800

(22) Filed: Oct. 1, 2009

(65) Prior Publication Data

US 2010/0020612 A1    Jan. 28, 2010

Related U.S. Application Data

(63) Continuation of application No. 11/763,489, filed on Jun. 15, 2007, now Pat. No. 7,616,493, which is a continuation of application No. 11/193,442, filed on Aug. 1, 2005, now Pat. No. 7,248,502.

(30) Foreign Application Priority Data

Aug. 13, 2004  (JP) ................................. 2004-235885

(51) Int. Cl.
*G11C 11/34* (2006.01)

(52) U.S. Cl. ................................................ 365/185.18
(58) Field of Classification Search .............. 365/185.18
See application file for complete search history.

(56) References Cited

U.S. PATENT DOCUMENTS

| | | | |
|---|---|---|---|
| 5,828,596 A | 10/1998 | Takata et al. | |
| 6,351,179 B1 | 2/2002 | Ikehashi et al. | |
| 6,642,757 B2 * | 11/2003 | Ikehashi et al. | ............... 327/143 |
| 6,868,026 B2 | 3/2005 | Fujioka | |
| 6,901,012 B2 | 5/2005 | Ikehashi et al. | |

FOREIGN PATENT DOCUMENTS

| | | |
|---|---|---|
| JP | 2001-256790 | 9/2001 |
| JP | 2004-5946 | 1/2004 |
| JP | 2004-118908 | 4/2004 |

* cited by examiner

*Primary Examiner* — Hoai Ho
*Assistant Examiner* — Anthan Tran
(74) *Attorney, Agent, or Firm* — Oblon, Spivak, McClelland, Maier & Neustadt, L.L.P.

(57) ABSTRACT

When a voltage level detector detects that a supply voltage reaches a recovery voltage level that requires a recovery operation, a signal generator generates a recovery operation instructing signal for instructing the recovery operation. The recovery operation instructing signal is invalidated if a certain operation mode is executed and validated in other cases.

7 Claims, 9 Drawing Sheets

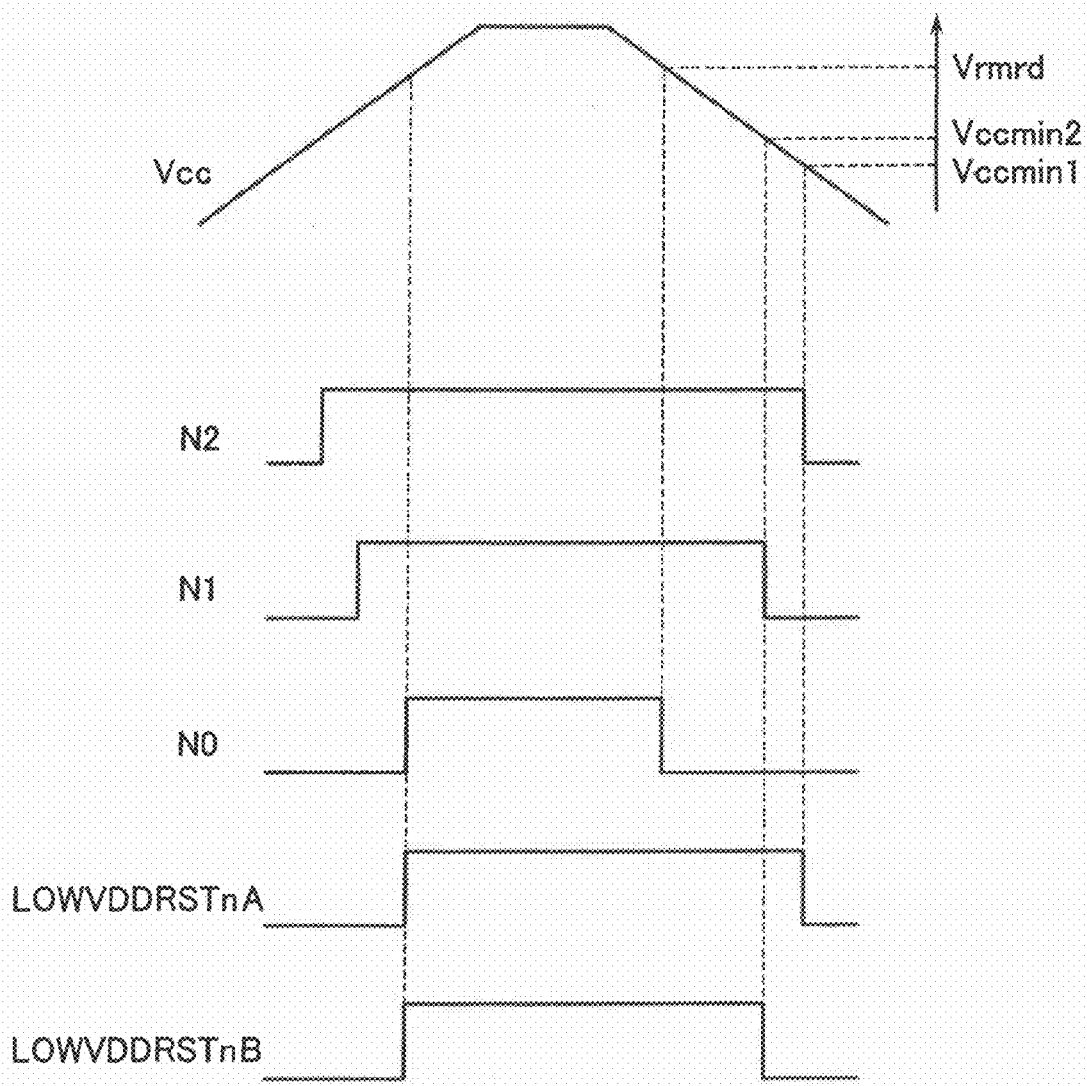

NON-VOLATILE SEMICONDUCTOR MEMORY DEVICE

CROSS-REFERENCE TO PRIOR APPLICATIONS

This application is a Continuation of and claims the benefit of priority under 35 USC §120 from U.S. patent application Ser. No. 11/763,489, filed Jun. 15, 2007 which is a continuation of application Ser. No. 11/193,442, filed Aug. 1, 2005, and is based upon and claims the benefit of priority from the prior Japanese Patent Application No. 2004-235885, filed on Aug. 13, 2004. The entire contents of these applications are incorporated herein by reference.

BACKGROUND OF THE INVENTION

1. Field of the Invention

The present invention relates to a non-volatile semiconductor memory device, and more particularly to a non-volatile semiconductor memory device of the type that reads initialization data stored in a specific region in a memory cell array for initializing (ROM reading) prior to a normal operation (user sequence).

2. Description of the Related Art

A semiconductor memory device such as a NAND-type flash memory requires that voltages in all circuits contained in the semiconductor memory device are retained higher than a minimum operable voltage (hereinafter referred to as a "recovery voltage"), Vccmin, for correct reading, writing (programming) and erasing without errors. For example, a 3V-driven NAND-type flash memory has a recovery voltage Vccmin of about 2.1 V (see FIG. 9A). When a supply voltage lowers below the recovery voltage Vccmin due to an occurrence of peak current, for example, a certain operation (recovery operation) is performed to halt the sequence during execution and initialize the voltages applied to each part for prevention of a malfunction or the like. The sequence once halted restarts when the supply voltage recovers above the recovery voltage Vccmin.

The semiconductor memory device reads out initialization data for various initializations after power is turned on, including redundancy data for replacing failed cells with redundancy cells and trimming data for adjusting timers and voltages, from a storage unit such as a fuse circuit (hereinafter this operation is referred to as "ROM reading"). The semiconductor memory device such as the NAND-type flash memory particularly assigns a specific region in a memory cell array to store the initialization data (see JP-A 2003-178589, for example).

ROM reading is required to start and finish after power is turned on and before the supply voltage reaches a spec-defined lower limit thereof, Vspmin, (for example, Vspmin=2.7 V in the case of the 3V-driven AND-type flash memory (see FIG. 9A)). A value of the supply voltage at the time of ROM reading start, Vrmrd, is hereinafter referred to as a "ROM reading start voltage". If the spec lower limit of the supply voltage, Vspmin, in the 3V-driven memory is equal to 2.7 V, the ROM reading start voltage Vrmrd can be determined between the recovery voltage Vccmin (2.1 V) and the spec lower limit Vspmin (2.7 V): for example, Vrmrd=about 2.3 V.

During execution of ROM reading, it is required to ensure such a recovery voltage Vccmin that makes the whole circuits in the memory operable. Even If ROM reading starts after the supply voltage once reaches the ROM reading start voltage Vrmrd, an occurrence of peak current may lower the supply voltage below the recovery voltage Vccmin. In this case, the recovery operation is required to halt ROM reading and initialize the voltages applied to each part in the memory cell because the reading error in ROM reading causes an ill effect on operation in the following user sequence.

In the case of the 3V-driven memory (FIG. 9A), a difference (margin) of 0.6 V can be provided between the spec lower limit Vspmin and the recovery voltage Vccmin even in the above numerical example. Therefore, there is little possibility that the supply voltage lowers below the recovery voltage in normal operations (such as reading, programming and erasing).

This margin is inevitably reduced, however, in a memory that is driven under a lower voltage. Accordingly, it is difficult to ensure ROM reading while keeping the spec range of the supply voltage. For example, as shown in FIG. 9B, a 1.8V-driven memory has a recovery voltage Vccmin of about 1.45 V, a spec lower limit Vspmin of about 1.65 V, and a ROM reading start voltage Vrmrd of about 1.5 V between both.

In this case, the ROM reading start voltage Vrmrd and the spec lower limit Vspmin just have a margin of 0.15 V therebetween. Therefore, there is a high possibility that the supply voltage reaches the spec lower limit Vspmin before the completion of ROM reading. An operation by the user such as input before the completion of ROM reading may cause an ill effect, for example, a malfunction possibly. In contrast, if the spec lower limit Vspmin is determined higher to prevent the ill effect, the spec range of the supply voltage is narrowed. If the ROM reading start voltage Vrmrd is determined close to the recovery voltage Vccmin, ROM reading cannot be performed with stability.

SUMMARY OF THE INVENTION

In one aspect of the present invention, a non-volatile semiconductor memory device comprises a memory cell array containing electrically erasable programmable non-volatile semiconductor memory cells. A controller is configured to control operations of reading, programming and erasing of data in the memory cell array. A decoder is configured to select a memory cell in the memory cell array based on an address signal. A sense amp is configured to sense and amplify data from the memory cell array. A voltage level detector is configured to detect if a supply voltage reaches a recovery voltage level that requires a recovery operation. A signal generator is configured to generate a recovery operation instructing signal for instructing a recovery operation that halts operations of reading, programming and erasing and initiates voltages on parts when the voltage level detector detects that the supply voltage reaches the recovery voltage level. Finally, a switching circuit is configured to invalidate the recovery operation instructing signal if a certain operation mode is executed and to validate the recovery operation instructing signal in other cases.

BRIEF DESCRIPTION OF THE DRAWINGS

FIG. 7 shows waveforms of various signals in circuits in FIG. 6;

DETAILED DESCRIPTION OF THE PREFERRED EMBODIMENTS

Embodiments of the present invention will now be described with reference to the drawings.

Figure 1:
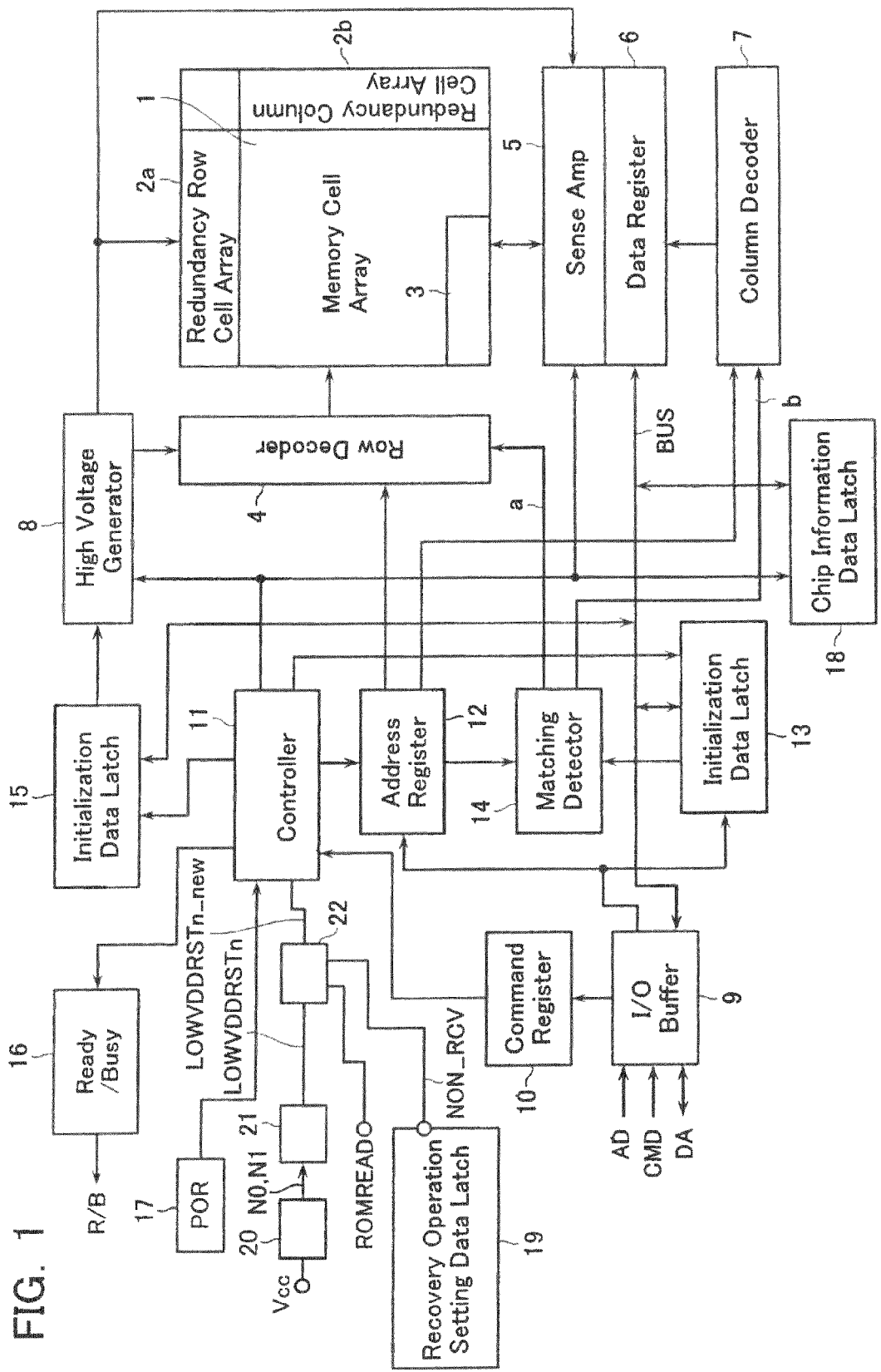
FIG. 1 shows a configuration of an EEPROM according to a first embodiment of the present invention.

FIG. 1 shows a configuration of an EEPROM according to an embodiment of the present invention. A memory cell array 1 includes electrically erasable programmable non-volatile memory cells arranged in matrix. The non-volatile memory cell has a stacked-gate MOS structure that includes a floating gate and a control gate stacked thereon. The memory cell array 1 includes a redundancy row cell array 2a and a redundancy column cell array 2b for replacement of failed cells. The memory cell array 1 also includes an initialization data region 3, which is previously determined as a region employed to write initialization data therein that determines a memory operating condition.

Figure 2:
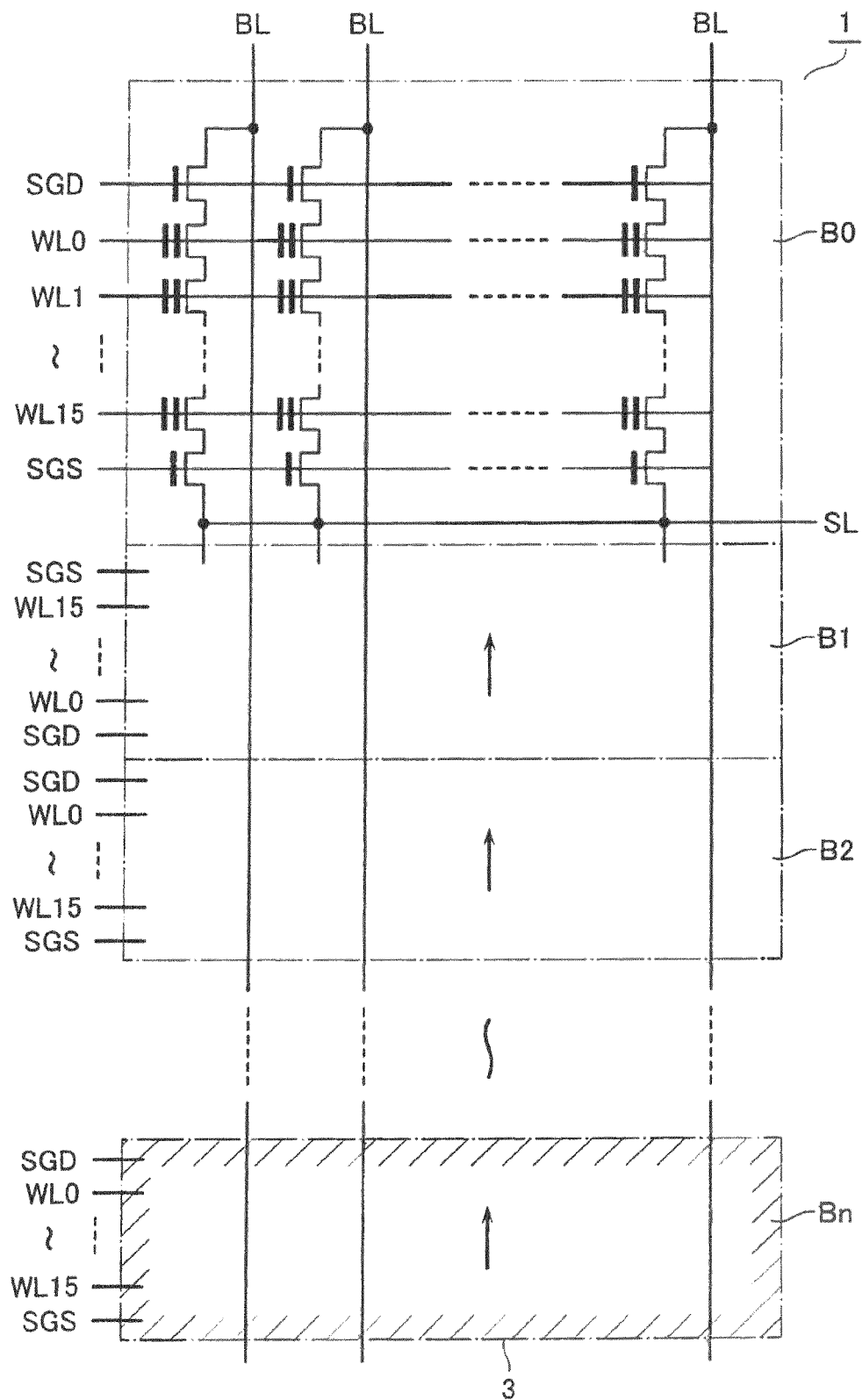
FIG. 2 shows a configuration of a memory cell array 1 in FIG. 1.

FIG. 2 shows an example of a specific configuration of the memory cell array 1. In this example, 16 memory cells serially connected configure a NAND cell unit. A plurality of NAND cell units with word lines WL arranged commonly configure a cell block that is defined as a minimum unit for erasing data. A plurality of cell blocks B0, B1, . . . , Bn are arranged sharing bit lines BL. In such the memory cell array 1, for example, the cell block Bn shown with a dashed line in the figure is determined as the initialization data region 3 to store the initialization data therein.

The initialization data region 3 can be employed for programming, erasing and reading of data with selective driving of the bit line BL and the word line WL while it is not accessible from external during a normal operation (user sequence) in EEPROM as described later. Accordingly, on erasing data in a batch or on a block basis, the initialization data region 3 is not set in an erasing condition.

The minimum unit of the initialization data region 3 in the NAND-type EEPROM is the NAND cell block, which is the minimum erasing unit. This NAND cell block has the same configuration as those in main cells. Accordingly, it has the same layout and circuit operation as those in the normal NAND cell block and can be designed easily.

The bit line BL in the memory cell array 1 is connected via a sense amp 5 to a data register 6. A column decoder 7 and a row decoder 4 are provided to select the bit line BL and the word line WL in the memory cell array 1. An address AD, data DA and a command CMD are supplied to an I/O buffer 9, and the address is taken in an address register 12, the command in a command register 10, and the write data in a data register 6.

The address register 12 creates a row address and a column address, which are respectively decoded at the row decoder 4 and the column decoder 7 to select a memory cell. A high voltage generator 8 including a booster generates various high voltages, which are employed in data writing and erasing. The command taken in the command register 10 is decoded at a controller 11, for example, which sequentially controls data writing and erasing.

Control during data writing includes verifying to check the writing operation and the written state in the selected memory cell, and rewriting to an insufficiently written memory cell. Similarly, control during data erasing includes verifying to check the erasing operation and the erased state in the selected block, and re-erasing in the case of insufficient erasing. With setting of a write mode or an erase mode, a series of writing or erasing described above is controlled in the controller 1.

The initialization data written in the initialization date region 3 in the memory cell array 1 specifically includes (1) failed address data; (2) various control data on data reading, programming and erasing (containing data of voltage values, the number of control loops for writing and erasing, the presence/absence of execution of the recovery operation in each operation mode, and a recovery voltage level in the case of execution); and (3) chip information (ID code) such as codes associated with a memory capacity and spec and a maker code. The initialization data is written in the initialization data region 3 after chip packaging and before product shipping, for example, with input of a particular command.

The row decoder 4 and the column decoder 7 are allowed to access the entire memory cell array 1 including the initialization data region 3 while no address is assigned to the initialization data region 3 in normal data writing and reading. Accordingly, the initialization data region 3 can not be designated with an external address. Only when a particular command enters, the controller 11 controls the address register to create an internal address required to access the initialization data region 3, which allows the initialization data to be written in the initialization data region 3.

In the EPROM after the initialization data is thus stored in the initialization data region 3, the initialization data written in the initialization data region 3 is readout at power-on to initialize the operating condition (this operation is referred to as "ROM reading" in this specification). FIG. 1 shows an initialization data latch 13 for storing a failed address; an initialization data latch 15 for storing control data to control the high voltage generator 8; a chip information data latch 18 for storing chip information; and a recovery operation setting data latch 19 for storing recovery operation information. Data reading (ROM reading) from the initialization data region 3 and transfer control of the read data to the initialization data latches 13 and 15, the chip information data latch 18 and the recovery operation setting data latch 19 are automatically controlled at the controller 11.

When power is turned on, a power-on reset circuit 17 begins operating. The controller 11 detects the power-on and controls the address register 12 to create an internal address, which is set in a ROM reading mode after a certain waiting time for power stabilization and is subsequently incremented sequentially to scan the initialization data region 3. The internal address for use in accessing the initialization data region 3 is not assigned in normal operations as described above. The data in the initialization data region 3 selected by the row decoder 4 and the column decoder 7 is read at the sense amp 5, transferred to the data register 6 and held therein. It is then transferred via a data bus BUS to the initialization data latches 13 and 15, the chip information data latch 18 and the recovery operation setting data latch 19 and held therein. During the above initialization, the controller 11 provides a Ready/Busy signal (R/B)=L (Busy) to inform external of access inhibition.

Such the ROM reading is important to allow the normal operation (user sequence) to be executed without any malfunction and, for prevention of failed reading, it should be executed with keeping the recovery voltage. On the other hand, during execution of the user sequence, the use of the recovery voltage set for ROM reading as it is may possibly prevent smooth execution of the user sequence on the contrary. In this embodiment, for stable execution of the ROM reading and smooth execution of the user sequence, a voltage level detector 20, a signal generator 21 and a switching circuit 22 are provided.

Figure 3A:
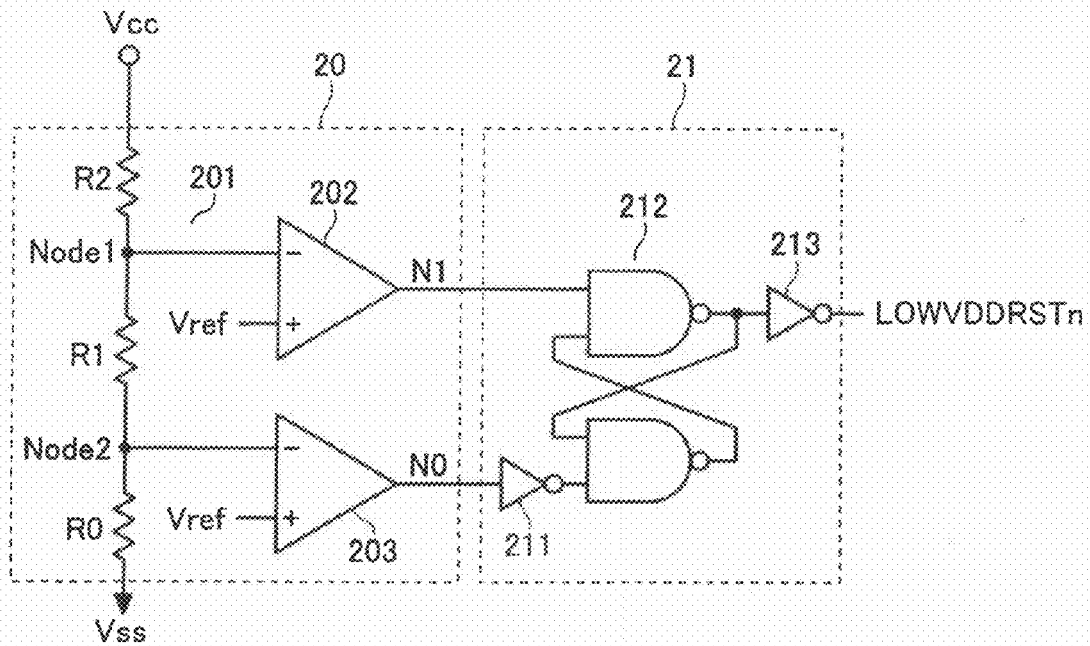
FIG. 3 shows an example of a specific configuration of a voltage level detector 20 and a signal generator 21 and an operational example thereof.

A configuration of the voltage level detector 20 and the signal generator 21 is described with reference to FIG. 3. The voltage level detector 20 comprises a resistor train 201 and comparators 202 and 203 as shown in FIG. 3A. The resistor train 201 includes serially connected resistors R0-R2 and has one end supplied with a supply voltage Vcc and the other end supplied with a ground voltage Vss. The comparator 202 has input terminals supplied with a voltage on a node Node1 between the resistors R2 and R1 and a reference voltage Vref and is configured to provide an output signal N1. The comparator 203 has input terminals supplied with a voltage on a node Node2 between the resistors R1 and R0 and the reference voltage Vref and is configured to provide an output signal N0. The output signal N1 is controlled to change logic when the supply voltage Vcc equals a recovery voltage Vccmin (of 1.45 V in this case). The output signal No is controlled to change logic when the supply voltage Vcc equals a ROM reading start voltage (of 1.5 V in this case) (see FIG. 3B). The resistors R0-R2 are set to have such resistances that cause the above logical change.

The signal generator 21 comprises an inverter 211, a flip-flop 212 and an inverter 213. The flip-flop 212 receives the output signal N1 and the inverted signal of the output signal N0 as input signals. The output signal from the flip-flop is further inverted through the inverter 213 and provided as an output signal LOWVDDRSTn. This output signal LOWVDDRSTn serves as a ROM reading start instructing signal for instructing the ROM reading to start and also serves as a recovery operation instructing signal for instructing the recovery operation to start.

Figure 3B:
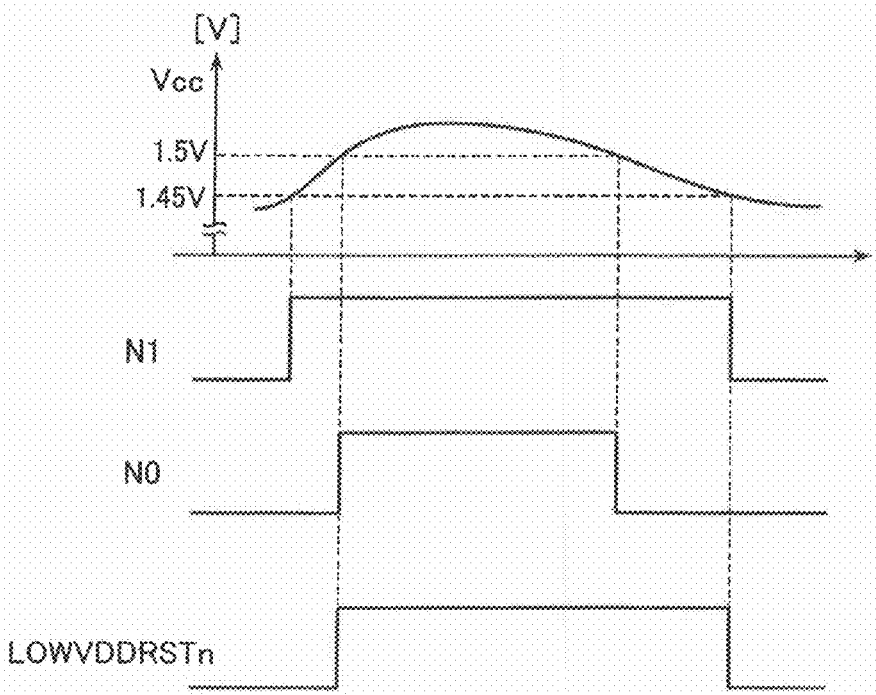

In this configuration, the output signal LOWVDDRSTn has such a hysteresis as shown in FIG. 3B that it rises when the supply voltage Vcc reaches the ROM reading start voltage Vrmrd (1.5 V) and falls when the supply voltage Vcc lowers again below the recovery voltage Vccmin (1.45 V).

Figure 4:
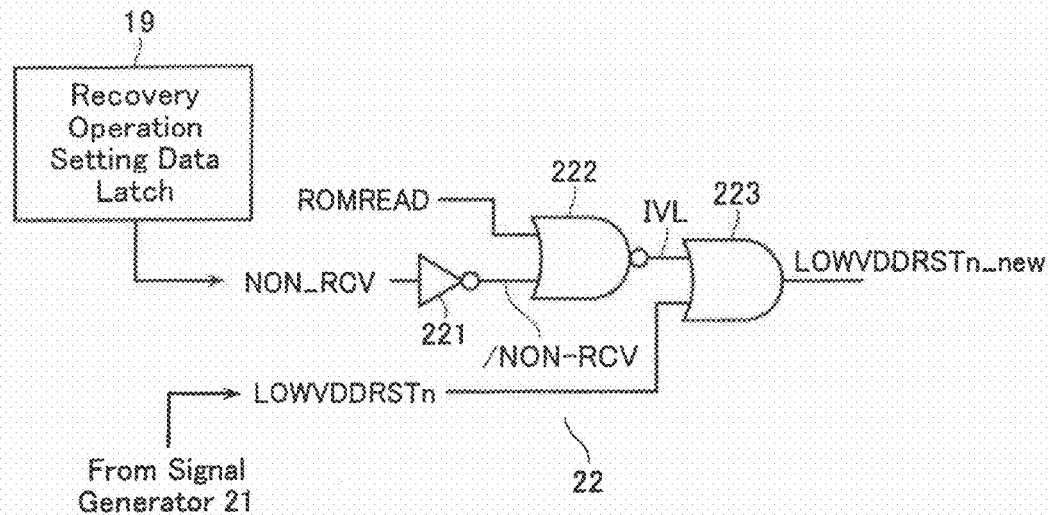
FIG. 4 shows an example of a specific configuration of a switching circuit 22.

FIG. 4 shows an example of a specific configuration of the switching circuit 22. The switching circuit 22 comprises an inverter 221, a NOR circuit 222 and an OR circuit 223. This configuration has a function to switch between execution and non-execution of the recovery operation based on data in the recovery operation setting data latch 19 in the case of execution of other modes than the ROM reading mode, that is, the user sequence modes (such as reading, writing and erasing).

The inverter 221 inverts a signal NON_RCV (that indicates non-execution of the recovery operation in a certain operation mode) output from the recovery operation setting data latch 19 to provide the inverted signal /NON_RCV. The NOR circuit 222 receives the inverted signal /NON_RCV and a signal ROMREAD (that becomes "H" during execution of ROM reading and "L" in other cases) indicative of the ROM reading mode as input signals to provide a NOR output signal IVL.

When either of the signal ROMREAD and the inverted signal /NON_RCV is equal to "H", the output signal IVL becomes "L", which makes the output signal LOWVDDRSTn_new from the OR circuit 223 equal to the output signal LOWVDDRSTn. Therefore, the recovery operation is started when the supply voltage Vcc reaches the recovery voltage Vccmin.

When both the signal ROMREAD and the inverted signal /NON_RCV are equal to "L", the output signal IVL becomes "H", which makes the output signal LOWVDDRSTn_new from the OR circuit 223 equal to the same "H" waveform of the output signal IVL. Therefore, the recovery operation is not executed even when the supply voltage Vcc lowers below the recovery voltage Vccmin. In a word, the output signal IVL functions as a recovery operation inhibiting signal that inhibits the recovery operation when a certain operation mode is executed.

Figure 5:
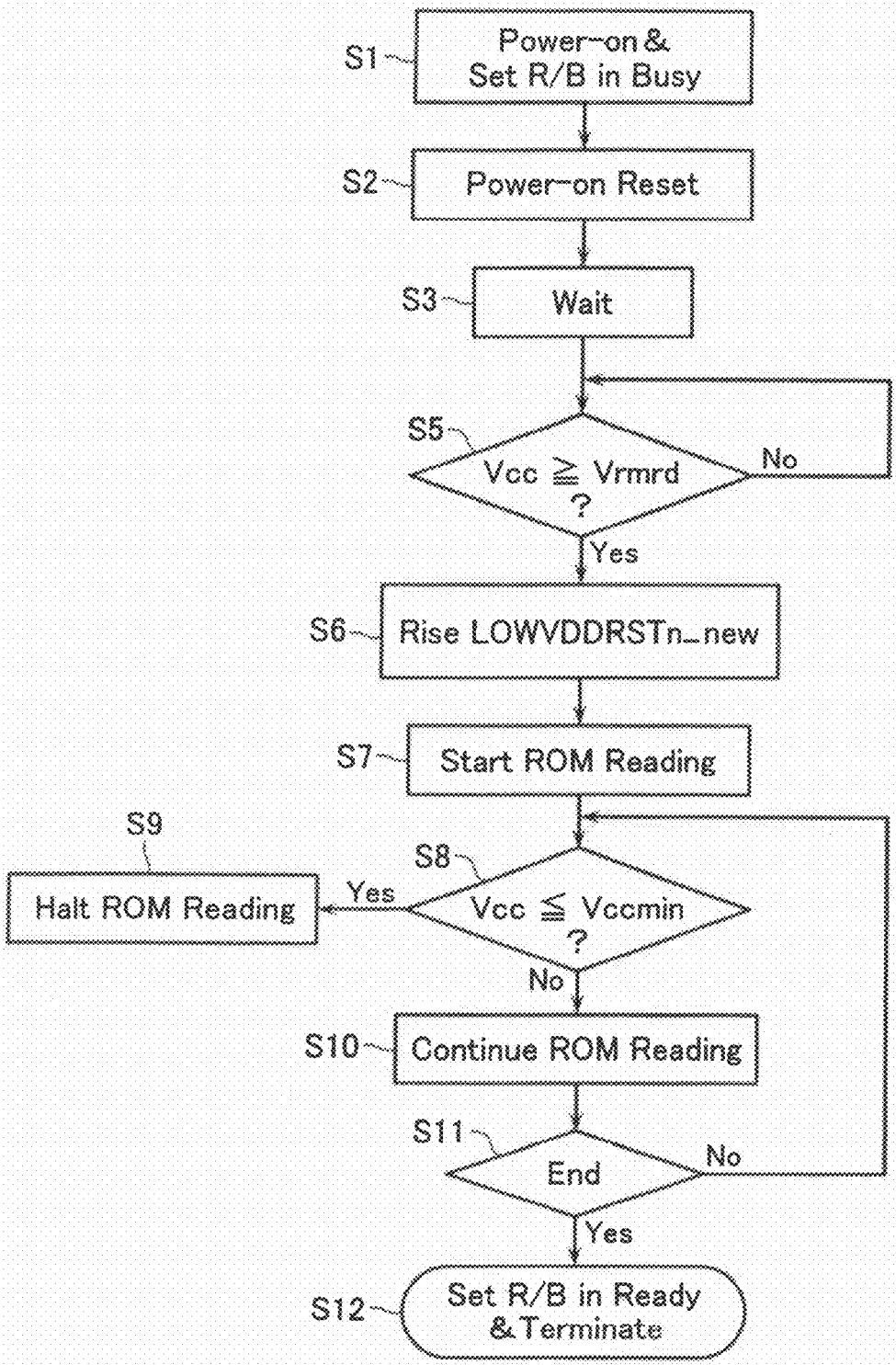
FIG. 5 is a flowchart showing operation of the EEPROM in FIG. 1.

FIG. 5 shows an exemplary control flow of the above initializing operation. On detection of power-on, R/B is set in Busy (S1). The signal ROMREAD is set at "H". The power-on reset circuit 17 performs a power-on reset (S2), then the flow waits for a certain period of time (S3). When the voltage level detector 20 detects elevation of the supply voltage Vcc above the ROM reading start voltage Vrmrd (S5), the output signal LOWVDDRSTn_new from the OR circuit 223 rises from "L" to "H" (S6), and the controller 11 starts ROM reading (S7).

During execution of ROM reading, when the voltage level detector 20 detects reduction of the supply voltage Vcc below the recovery voltage Vccmin (S8), ROM reading is halted (S9). While the supply voltage Vcc exceeds the recovery voltage Vccmin, ROM reading is continued (S10). The voltage level detector 20 continuously detects the level of the supply voltage Vcc until the reading is completed (S11, S12). When ROM reading is completed, R/B is set in Ready (Standby).

After completion of ROM reading, the signal ROMREAD falls from "H" to "L", with R/B=H (Ready), which allows for execution of the user sequence mode (normal reading, writing and erasing). When an address enters during the user sequence mode, the address taken in the address register 12 is detected in a matching detector 14 if it matches with the failed address held in the initialization data latch 13. On detection of matching, it provides replacement control signals a and b. These control signals a and b control the row decoder 4 and the column decoder 7 to replace a failed cell with redundancy cell arrays. Depending on a writing, erasing or reading mode, the control data held in the initialization data latch 15 is employed to control the high voltage generator 8 to generate a required voltage. As the signal ROMREAD is kept at "L", the recovery operation can not be started even if the supply voltage Vcc lowers below the recovery voltage Vccmin. Thus, as the supply voltage during execution of the user sequence has a widely set margin in this embodiment, the user sequence can be executed smoothly.

Figure 8:
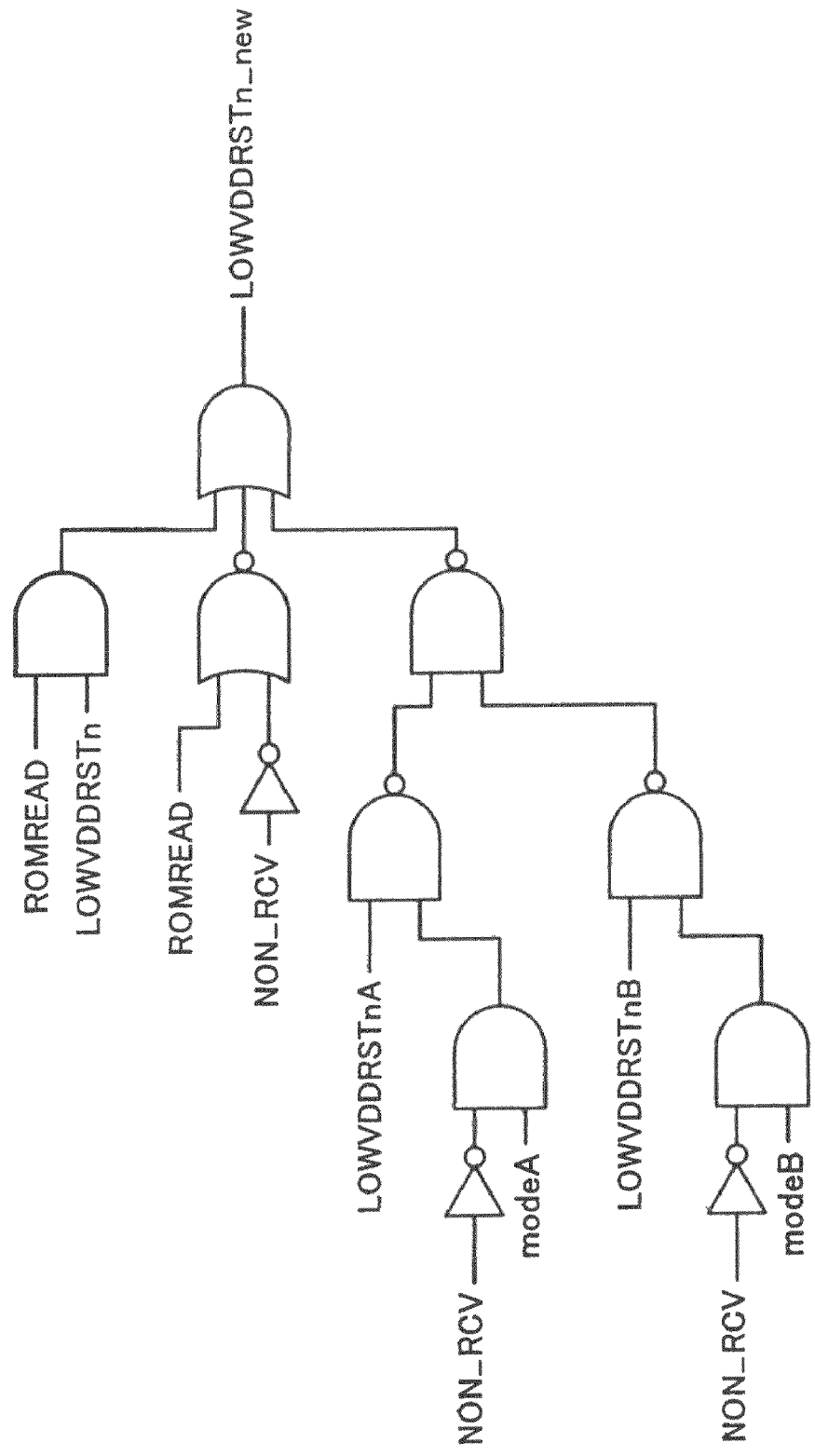
FIG. 8 shows a configuration example of a switching circuit 22 according to the second embodiment of the present invention.
Figures 9A, 9B:
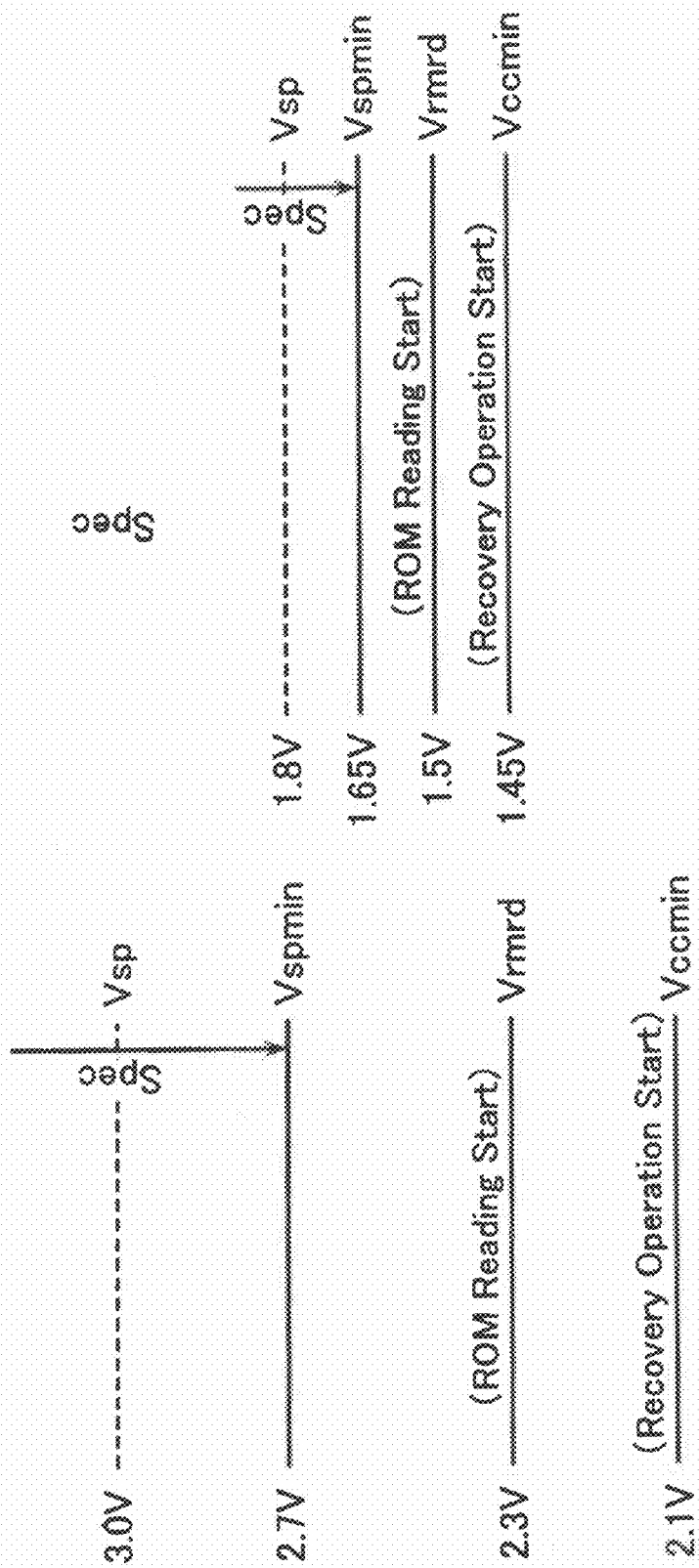
FIGS. 9A and 9B show a relation among a spec lower limit of a supply voltage, a ROM reading start voltage and a recovery voltage in a conventional NAND-type EEPROM.

A second embodiment of the present invention will now be described with reference to FIGS. 6-8.

This embodiment assumes that the recovery voltage Vccmin has a plurality of possible settings depending on a plurality of different operation modes (two operation modes A and B in this example). Therefore, the voltage level detector 20, the signal generator 21 and the switching circuit 22 are provided with additional alterations. This point differs from the first embodiment. Other parts are in common with the first embodiment and their detailed descriptions are omitted accordingly.

Figure 6:
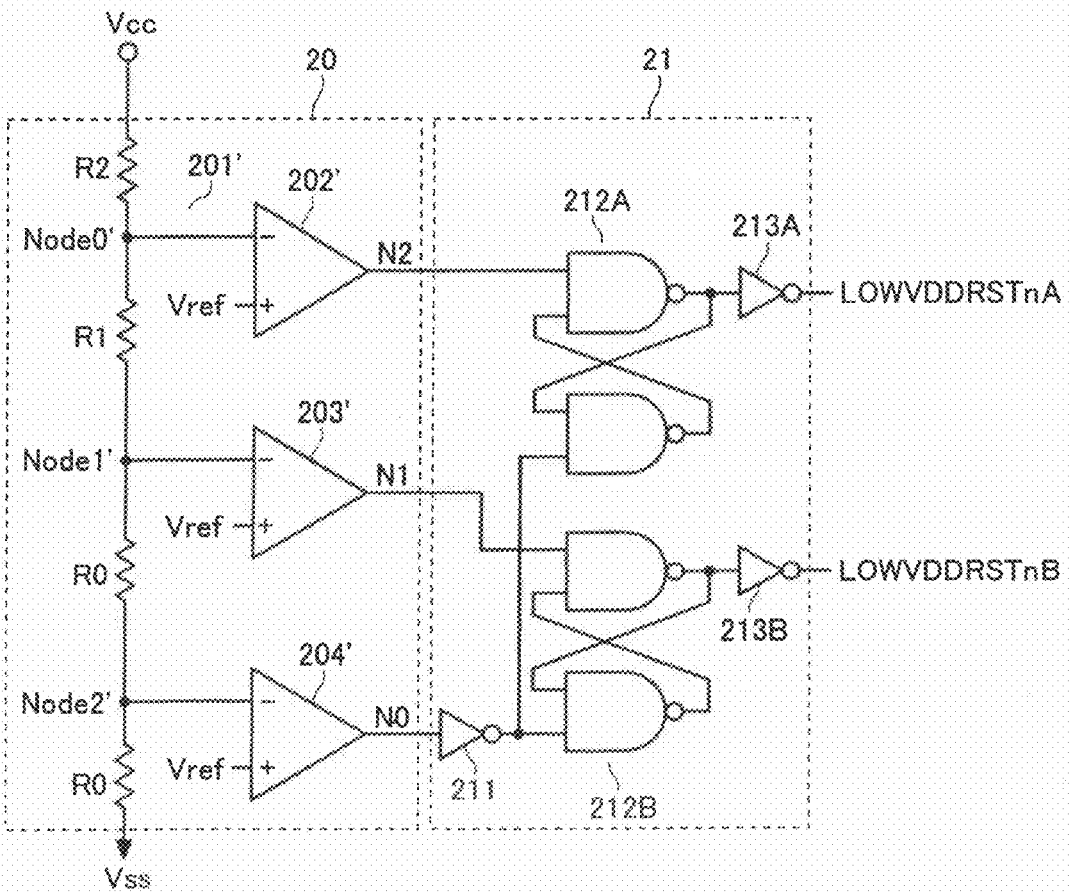
FIG. 6 shows an example of a specific configuration of a voltage level detector 20 and a signal generator 21 according to a second embodiment of the present invention.

An exemplary configuration of the voltage level detector 20 and the signal generator 21 in the second embodiment is shown in FIG. 6. The voltage level detector 20 comprises a comparator 202' to detect a first recovery voltage Vccmin1 for use in the operation mode A and a comparator 203' to detect a second recovery voltage Vccmin2 for use in the operation mode B, which is higher than the first recovery voltage Vccmin1. A comparator 204' is employed to detect the ROM reading start voltage Vrmrd similar to the comparator 203 in FIG. 3.

This embodiment provides, in addition to the output signal LOWVDDRSTn, two output signals LOWVDDRSTnA and LOWVDDRSTnB. As shown in FIG. 7, the former is such a signal that rises when the supply voltage Vcc reaches a ROM reading start voltage Vddmin and falls when it reaches the first recovery voltage Vccmin1. As shown in FIG. 7, the latter is such a signal that rises when the supply voltage Vcc reaches the ROM reading start voltage Vddmin and falls when it reaches the second recovery voltage Vccmin2. The use of the former signal in the operation mode A and the latter signal in the mode B can set different recovery voltages based on the operation modes. FIG. 8 shows an exemplary configuration of the switching circuit 22 to attain such the operation. If there is a need for setting the recovery operation to be not executed in any of the operation modes A and B, setting the signal NON_RCV at "H" makes the output signal LOWVDDRSTn_new never fall at the recovery voltage Vccmin.

Figure 10:
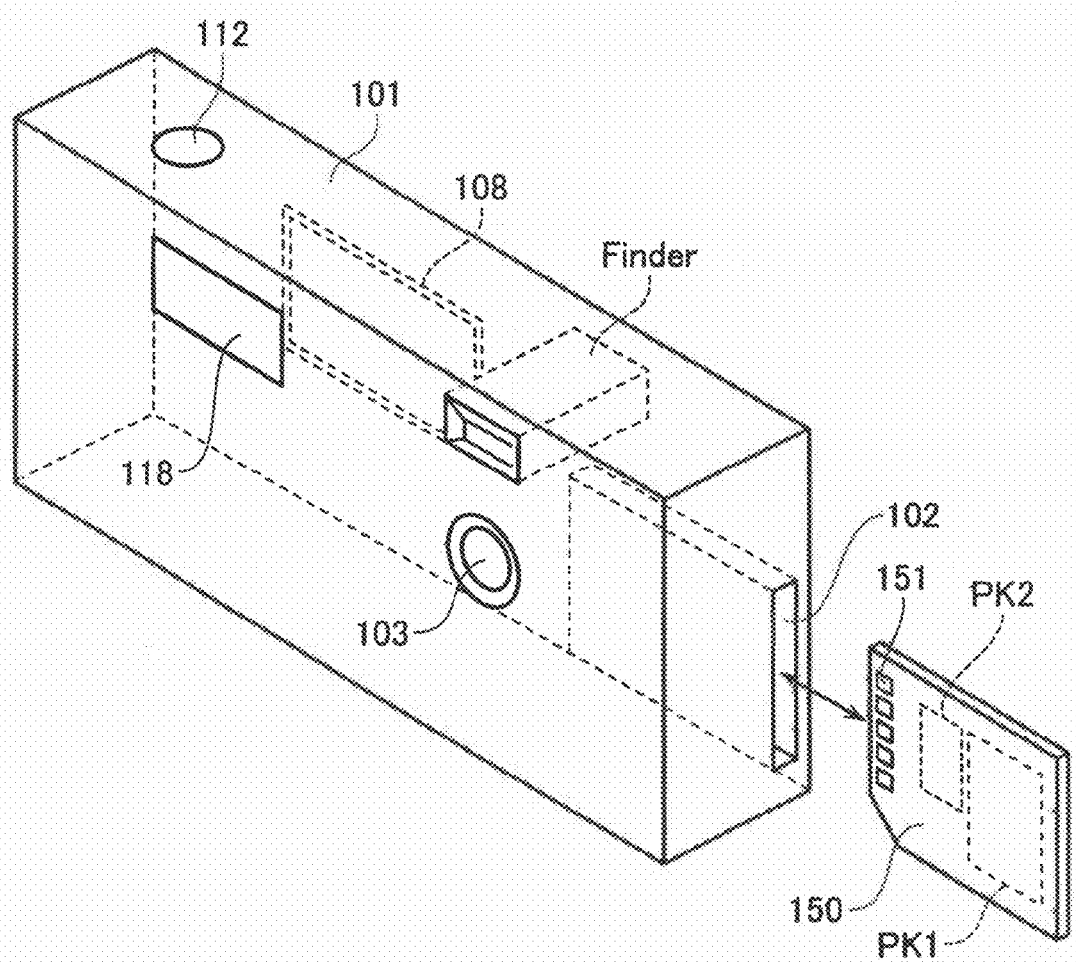
FIG. 10 shows an EEPROM-mounted electronic card according to the embodiment of the present invention and an electronic device that utilizes the card.

The following description is given to one embodiment of an electronic card with the NAND-type EEPROM according to the above embodiments mounted thereon, and an electronic device with the electronic card. FIG. 10 shows a configuration of the electronic card according to this embodiment and the electronic device with the electronic card. The electronic device is a digital still camera 101 herein exemplified as a portable electronic instrument. The electronic card is a memory card 150 used as a storage medium for the digital still camera 101. The memory card 150 comprises an IC package PK1 that includes the NAND-type EEPROM described in the above embodiments integrated and sealed therein; an IC package PK2 that includes a memory controller integrated and sealed therein to control the EEPROM; and connection terminals 151. The digital still camera 101 has a casing, which houses a card slot 102 and a circuit board, not shown, connected to the card slot 102. The memory card 150 is detachably attached to the card slot 102. When the memory card 150 is attached to the card slot 102, it is connected to electric circuits on the circuit board.

The embodiments of the invention have been described above while the present invention is not limited to these embodiments. Rather, various modifications, additions and replacements can be devised without departing from the spirit and scope of the invention.

The invention claimed is:

1. A method for operating a memory device, comprising:
   detecting that a supply voltage reaches an initialization start voltage to generate a start signal for starting initialization;
   starting initialization based on the start signal;
   detecting that the supply voltage decrease below a recovery voltage to generate a recovery operation instructing signal for starting a recovery operation, the recovery operation comprising an operation of 1) halting operation of reading, programming, or erasing, and 2) initiating voltages applied at least to a memory cell array when the supply voltage decreases below the recovery voltage;
   validating the recovery operation instructing signal while the initialization is performed; and
   invalidating the recovery operation instructing signal after the initialization is terminated.

2. The method according to claim 1, wherein the memory device includes the memory cell array having electrically erasable programmable non-volatile semiconductor memory cells.

3. The method according to claim 1, further comprising:
   receiving a recovery operation inhibiting signal for inhibiting execution of the recovery operation;
   the recovery operation instructing signal being invalidated in response to receipt of the recovery operation inhibiting signal.

4. The method according to claim 1, wherein the memory cell array is partly used as an initialization data region for storing initialization data that determines a memory operating condition.

5. The method according to claim 4, wherein the initialization includes replacing failed cells in the memory cell array with redundancy cells.

6. The method according to claim 1, wherein the initialization includes a trimming operation.

7. The method according to claim 2, wherein the memory cell array comprises a NAND cell unit including a plurality of memory cells connected in series.

* * * * *